(12) United States Patent
Hao

(10) Patent No.: US 6,889,627 B1
(45) Date of Patent: May 10, 2005

(54) SYMMETRICAL SEMICONDUCTOR REACTOR

(75) Inventor: Fangli Hao, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 74 days.

(21) Appl. No.: 10/189,111

(22) Filed: Jul. 3, 2002

Related U.S. Application Data

(60) Provisional application No. 60/311,064, filed on Aug. 8, 2001.

(51) Int. Cl.[7] ........................... C23C 16/00; H05H 1/00
(52) U.S. Cl. .................. 118/723 R; 118/733; 118/715; 156/345.31; 156/156.32
(58) Field of Search ............................. 118/723 R, 733, 118/715, 719; 156/345.31, 345.32, 345.54

(56) References Cited

U.S. PATENT DOCUMENTS

| | | | | |
|---|---|---|---|---|
| 5,641,375 A | * | 6/1997 | Nitescu et al. ............ 156/345.1 |
| 6,165,271 A | * | 12/2000 | Zhao et al. ................. 118/715 |
| 6,192,827 B1 | * | 2/2001 | Welch et al. ............ 118/723 E |
| 6,221,782 B1 | * | 4/2001 | Shan et al. ................. 438/710 |
| 6,408,786 B1 | * | 6/2002 | Kennedy et al. ...... 118/723 AN |
| 6,647,918 B1 | * | 11/2003 | Welch et al. ............ 118/723 R |

FOREIGN PATENT DOCUMENTS

JP    2000114179 A  *  4/2000   ......... H01L/21/205

* cited by examiner

*Primary Examiner*—Parviz Hassanzadeh
(74) *Attorney, Agent, or Firm*—IP Strategy Group PC

(57) ABSTRACT

A symmetrical semiconductor reactor for semiconductor processing, comprising a liner, a process chamber, a valve chamber, a slot valve plate, a liner aperture plate, a rod, and an actuator. The liner has a liner aperture adapted to provide passage for a wafer and to receive the liner aperture plate. The process chamber is coupled to the liner and the valve chamber. The actuator is coupled to the slot valve plate and moves the slot valve plate from the "closed" to the "open" position and vice versa. Since the slot valve plate is coupled to the liner aperture plate by the rod, the actuator is capable of moving the slot valve plate and the liner aperture plate at the same time. However, the precise movements of the liner aperture plate are dependent on the particular rod embodiment.

27 Claims, 8 Drawing Sheets

SYMMETRICAL SEMICONDUCTOR REACTOR

The present patent application is related to provisional patent application 60/311,064 filed on Aug. 8, 2001 titled "Design for Symmetrical Chamber Compensator with Two Degrees of Freedom Without Adding Actuator" which is hereby incorporated by reference.

BACKGROUND OF THE INVENTION

1. Field of Invention

The present invention relates to reactors for semiconductor processing. More particularly, the present invention provides an apparatus for generating a substantially symmetrical reactor for semiconductor processing.

2. Description of Related Art

Semiconductor manufacturing includes the cyclic repetition of several major process steps. Many fabrication processes involve chemical reactions that take place in reactors. The driving force for these chemical reaction processes is to optimize the required chemical reactions by introducing the correct chemicals in the proper vacuum environment while providing energy to drive the reaction. During these chemical action processes, detrimental aspects of the reaction are minimized, such as exposure to moisture, the ambient environment, and contaminants. This optimum condition is reached by carefully introducing the necessary mix of precursor chemicals into the reactor, and then monitoring the chemical reaction to achieve the desired conditions on the wafer surface.

Often chemical reactions for wafer processing occur within the reactor. The reactor is a controlled vacuum environment where chemical reactions occur under controlled conditions. Typically, the following functions are performed within the reactor: controlling gas flow within the reactor and near the wafer; maintaining a prescribed pressure inside the reactor; removing undesirable by-products from the reactor; creating an environment for chemical reactions such as plasma to occur, and controlling the heating and cooling of the water.

Referring to FIG. 1 there is shown an isometric view of a prior art reactor 10 used for semiconductor manufacturing. Typically, the reactor 10 comprises a liner 12, a process chamber 14 and a valve chamber 16. Typically, the liner 12 and the valve chamber 16 are coupled to the process chamber 14. The liner 12, process chamber 14 and valve chamber 16 are adapted to receive a wafer (not shown) through a slotted opening 18 that includes a liner aperture, a process chamber aperture and a valve chamber aperture. The wafer is transported in and out of the reactor via opening 18 with a transport module (not shown). The wafer sits on the liner 12. The wafer surface is then exposed to the various gases or liquids that are applied in the process chamber 14.

Referring to FIG. 2A, there is shown a cross-sectional view of the prior art reactor 10. The valve chamber 16 and the process chamber 14 are shown as separate components. Alternatively, the valve chamber 16 and the process chamber 14 may be joined together. As shown in FIG. 2A, the liner 12 sits on the process chamber 14.

Referring to FIG. 2B as well as FIG. 1, there is shown an exploded view of the opening 18 and the interface between the liner 12, the process chamber 14 and the valve chamber 16. The opening 18 includes a liner aperture 20 which is a slot defined by the liner 12 adapted to provide passage to a wafer (not shown). The liner aperture 20 is curved and follows the cylindrically shaped portion of the liner 12. The opening 18 also includes a process chamber aperture 22 which is a slot defined by the process chamber 14. The process chamber 14 has a planer face that is adapted to interface with the valve chamber 16. Further still, the opening 18 includes a valve chamber aperture 23 which is a slot defined by the valve chamber 16. The valve chamber aperture 23 is a planar slot configured to receive a slot valve plate 24 to cover the valve chamber aperture 23 so that an adequate vacuum seal can be achieved in the process chamber 14. The slot valve plate 24 is moved by an actuator 25 in a substantially vertical and horizontal direction, thereby provided two degrees of freedom to the movements of the slot valve plate. There is also a liner/chamber gap 26a and 26b which is defined by the gap between the liner 12 and the chamber 14.

In operation, the actuator 25 moves the slot valve plate 24 from a "closed" position to an "open" position and vice versa in a well-known predetermined manner. In the "closed" position, i.e. vacuum enabled position, the slot valve plate 24 covers the valve chamber aperture 23 and the process chamber aperture 22. In the "open" position, i.e. wafer passage position, the actuator 25 moves the slot valve plate 24 to provide passage to the wafer through the liner aperture 20, the process chamber aperture 22 and valve chamber aperture 23. Typically, the first movement of the slot valve plate 24 from the "closed" position to the "open" position requires the slot valve plate 24 to move in an essentially horizontally direction that is away from the valve chamber aperture. Typically, the second movement from the "closed" position to he "open" position requires the slot valve plate 24 to move in an essentially vertical direction that provides passage of the wafer into the reactor 10. Typically, the movement of the slot valve plate 24 from the "open" position to the "closed" position first requires the slot valve plate 24 to move vertically to cover the opening 18, and then secondly the slot valve 24 moves horizontally to sit on the valve chamber 16 and provide a vacuum seal for the valve chamber aperture 23.

In the "closed" position, the liner aperture 20 generates a non-uniform reactor that lacks symmetry. This lack of symmetry affects wafer processing. The resulting effects caused by this lack of symmetry include non-uniform gas distribution, non-uniform gas density, and non-uniform plasma density. Additionally, these effects are magnified by the industry wide trend to increase wafer size while decreasing feature sizes.

Therefore, there is a need to provide a symmetrical reactor that avoids the limitations associated with the non-uniform reactor described above. There are a variety of solutions that provide for the generation of a symmetrical reactor. However, these solutions require adding more actuators, adding bellows, or making substantial modifications to the existing reactor design.

Therefore, there is a need to provide a symmetrical reactor without requiring significant modifications to the well-known reactor design.

Additionally, there is a need for a symmetrical reactor that does not employ additional control circuitry or software.

SUMMARY OF INVENTION

A symmetrical semiconductor reactor for semiconductor processing, comprising a liner, a process chamber, a valve chamber, a slot valve plate, a liner aperture plate, a rod, and an actuator. The liner has a liner aperture adapted to provide passage for a wafer and adapted is to receive the line aperture plate. The process chamber is coupled to the liner and the valve chamber. The process chamber and valve chambers are each separate chambers having an aperture adapted to provide passage for a wafer. In one embodiment, the slot valve plate is configured to sit on the valve chamber aperture and covers the process chamber aperture, thereby permitting the generation of vacuum in the process chamber. In an alternative embodiment, the process chamber and valve chamber are combined into a single chamber, and the slot valve is configured to cover the combined chamber aperture and permit the generation of a vacuum in the chamber.

In a first rod embodiment, the rod is fixedly coupled to both the slot valve plate and to the liner aperture plate. In a second rod embodiment, the rod is a telescoping rod that moves slidably by being compressed and expanded in a substantially horizontal direction. In a third rod embodiment, the rod is slidably coupled to the slot valve plate and fixedly coupled to the liner aperture plate and moves slidably in a substantially vertical direction. In a fourth embodiment, the rod is both a telescoping rod that moves horizontally, and the rod is slidably coupled to the slot valve plate to move vertically.

The actuator is coupled to the slot valve plate and moves the slot valve plate from the "closed" position to the "open" position and vice versa. Since the slot valve plate is coupled to the liner aperture plate by the rod, the actuator is capable of moving the slot valve plate and the liner aperture plate at the same time. However, the precise movements of the liner aperture plate are dependent on the particular rod embodiment.

In operation, the actuator moves the slot valve plate in a well-known predetermined manner that provides passage to the wafer and permits the reactor to achieve a vacuum. In the "closed" position, i.e. vacuum enabled position, the liner aperture plate occupies the liner aperture and the slot valve plate covers the chamber aperture and forms a vacuum seal. In the "open" position, i.e. wafer passage position, the actuator moves the slot valve plate and the liner aperture plate to provide passage to the wafer through the liner aperture, the chamber aperture and valve aperture.

BRIEF DESCRIPTION OF THE DRAWINGS

Preferred embodiments of the present invention are shown in the accompanying drawings wherein.

DETAILED DESCRIPTION

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

The present invention is an apparatus for generating a substantially symmetrical reactor for semiconductor processing. An illustrative semiconductor reactor is a parallel plate plasma reactor used during the etching phase of wafer processing. An illustrative dual frequency plasma etch reactor is described in commonly owned U.S. Pat. No. 6,090,304, which is hereby incorporated by reference. Other alternative reactors include transformer coupled plasma (TCP™) etch reactors available from Lam Research Corporation which is also referred to as an inductively coupled plasma reactor, electron-cyclotron resonance (ECR) plasma reactors, a helicon plasma reactors, or the like. It shall be appreciated by those skilled in the art that reactors described above are provided as an illustrative example of semiconductor reactors. The semiconductor reactors described above do not include a description of all possible reactors that may employ the symmetrical reactor components of the present invention.

Figure 1:
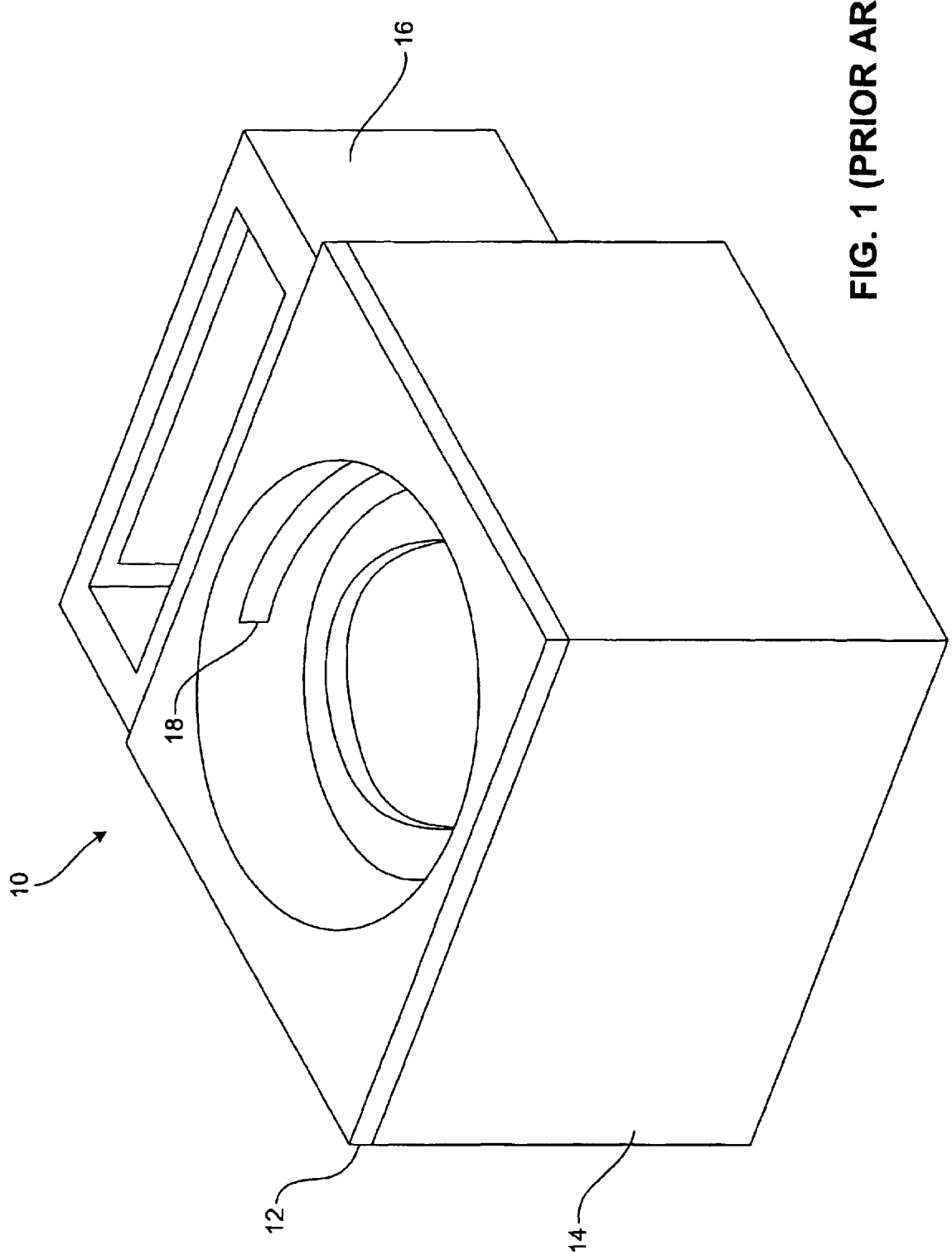
FIG. 1 shows an isometric view of an illustrative prior art reactor used for semiconductor manufacturing.
Figure 2A:
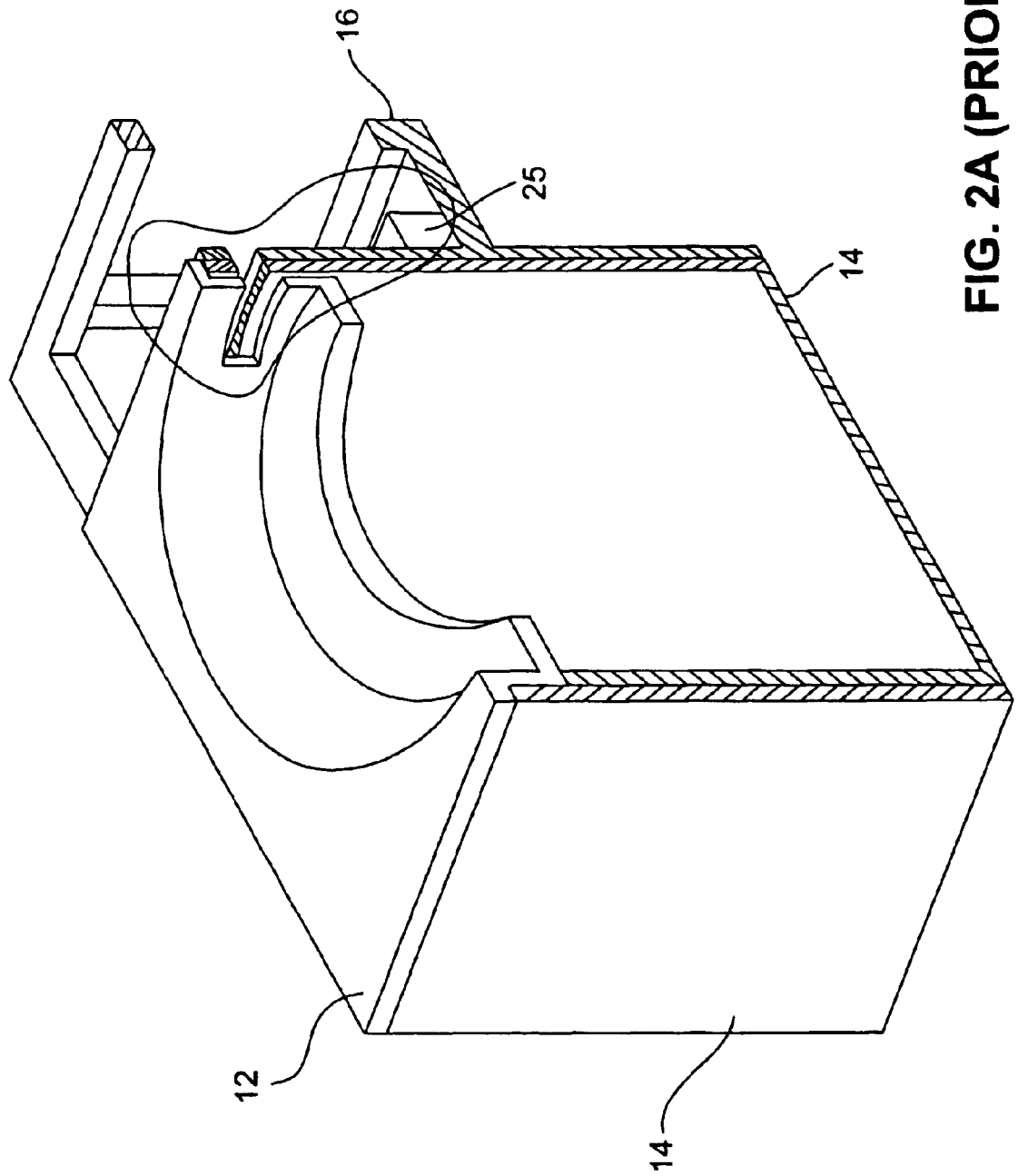
FIG. 2A shows a cross-sectional view of the illustrative prior art reactor shown in FIG. 1.
Figure 2B:
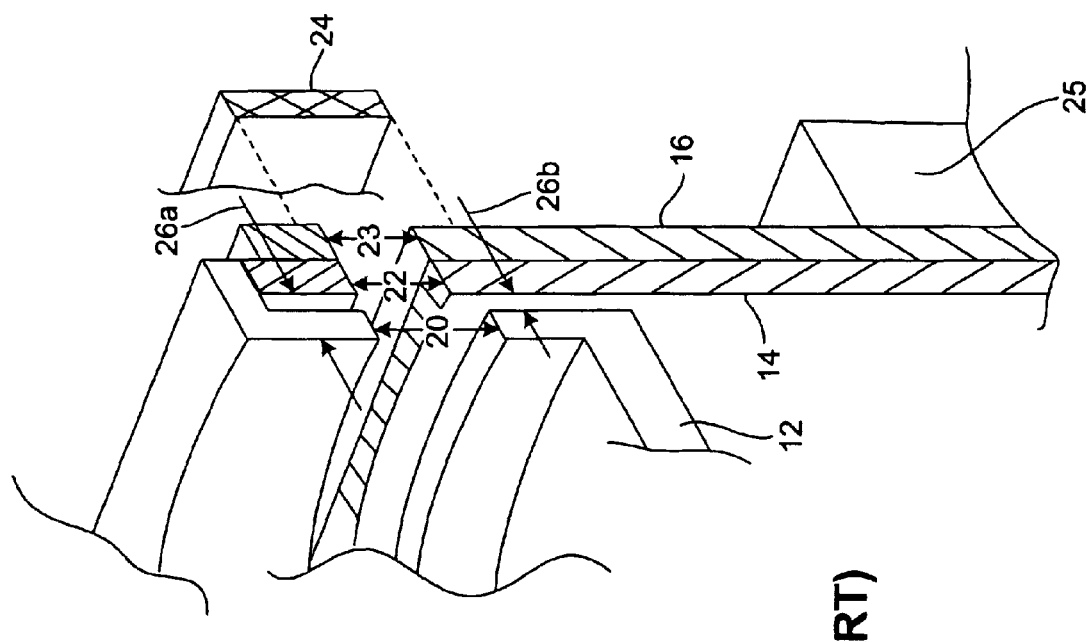
FIG. 2B shows an exploded view of the interface between the liner, the chamber and the valve of the illustrative prior art reactor.
Figure 3B:
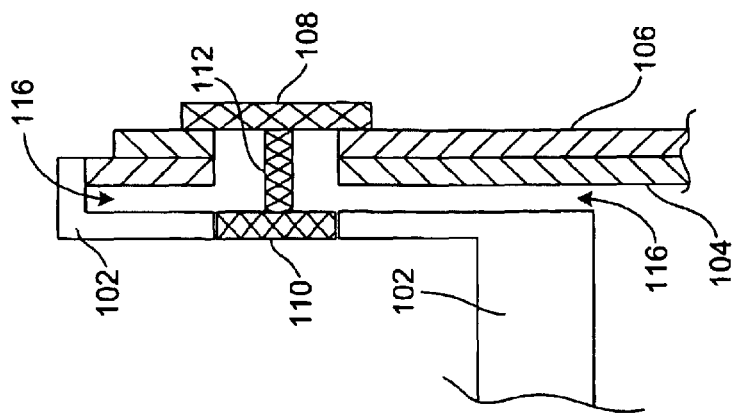
FIG. 3B shows a side view along plane X in FIG. 3A.
Figure 3A:
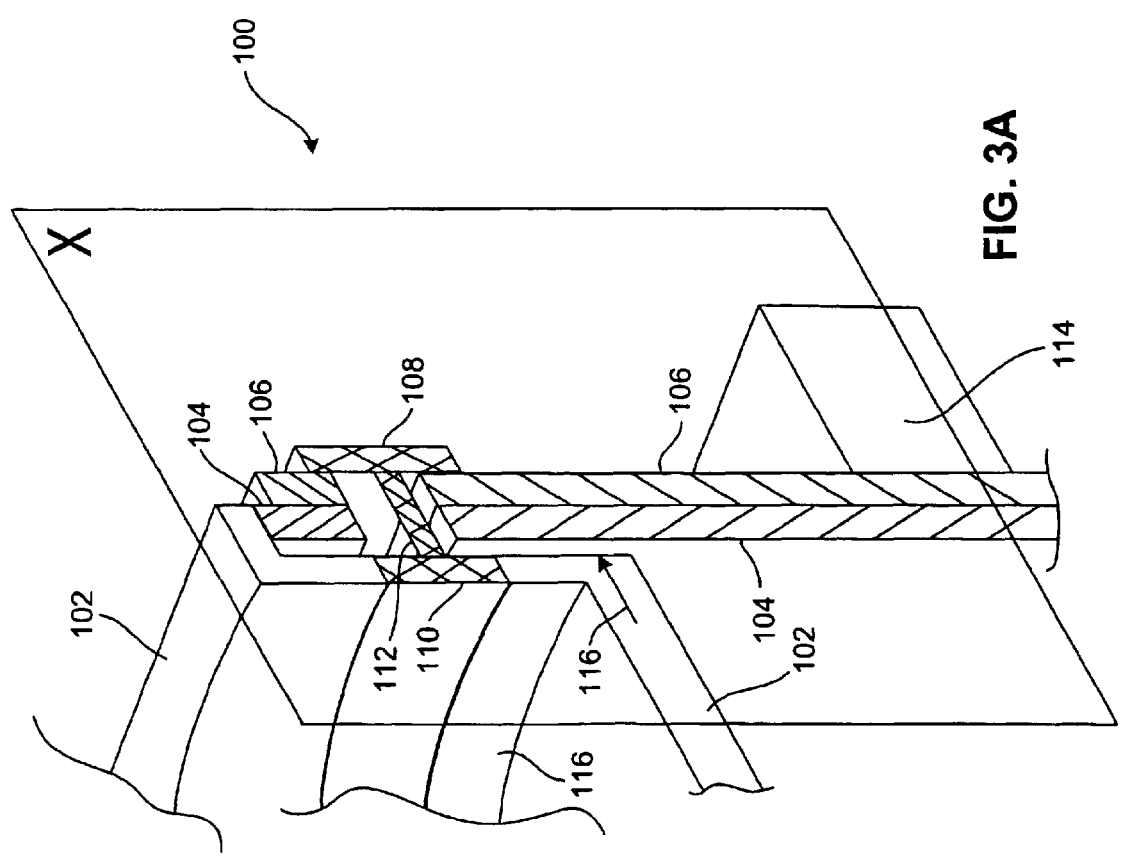
FIG. 3A shows an isometric view of the substantially symmetrical reactor.

Referring to FIG. 3A there is shown an isometric view of the elements in the substantially symmetrical reactor 100. FIG. 3B shows a side view along plane X in FIG. 3A. The elements of the substantially symmetrical reactor are shown in FIG. 3A and FIG. 3B in a "closed" position. The "closed" position permits the generation of a vacuum within the reactor during semiconductor processing by sitting on the valve chamber and covering the valve aperture.

FIG. 3A and FIG. 3B shows an exploded view of the interface between the liner, the process chamber and the valve chamber of an illustrative reactor. The substantially symmetrical semiconductor reactor 100 includes a liner 102, a process chamber 104, a valve chamber 106, a slot valve plate 108, a liner aperture plate 110, a rod 112, and an actuator 114. The liner 102 has a liner aperture that is occupied by the liner aperture plate 110, and the liner aperture is adapted to provide passage for a wafer (not shown). The liner 102 has a top cylindrical portion 102 that defines the curved slot referred to as the liner aperture.

The process chamber 104 is coupled to the liner 102 and the valve chamber 106. A gap 116 is defined by the liner 102 on one end and by the process chamber 104 on the other end. The process chamber 104 also has a slotted process chamber aperture adapted to provide passage for the wafer. For illustrative purposes only, the process chamber 104 has a curved cylindrical face proximal the liner 102. The process chamber 104 also has a planar face that is adapted to interface with the valve chamber 106. The valve chamber 106 has a planar face configured to interface with the process chamber 104 and a slotted valve chamber aperture configured to provide passage for the wafer.

In the illustrative reactor 100, the slot valve plate 108 is configured to "sit on" the valve chamber 104 and covers the valve chamber aperture, the process chamber aperture and the liner aperture, thereby permitting the generation of a vacuum in the process chamber 104. The liner aperture plate 110 is configured to occupy the liner aperture. The liner aperture plate 100 has sufficient clearance from the liner aperture to be able to move in and out of the liner aperture. It shall be appreciated by those of ordinary skill in the art having the benefit of this disclosure that an alternative embodiment combining the process chamber and valve chamber into a single chamber may be configured to perform the same function as the separate process chamber and valve chamber. In the alternative embodiment, a single aperture is provided for wafer transport and the slot valve plate 108 sits on or covers the single chamber aperture to allow for the formation of a vacuum in the single chamber. For purposes of this specification the term "chamber" shall be used to refer to either the first chamber embodiment having a separate process chamber and a separate valve chamber or the second chamber embodiment having a combined process chamber and valve chamber.

The rod 112 is coupled to the slot valve plate 108 and to the liner aperture plate 110. There are at least four different embodiments for coupling the rod 112 to the slot valve plate 108 to the liner aperture plate 110. In the first rod embodiment, the rod 112 is rigid and is fixedly coupled to both the slot valve plate 108 and the liner aperture plate 110. In the first embodiment, the rod 112 is not compressible or collapsible in the horizontal direction and the rod is not capable of moving vertically in relation to the slot valve plate 108. This first rod embodiment 112 is shown in FIGS. 3A and 3B.

Figure 5:
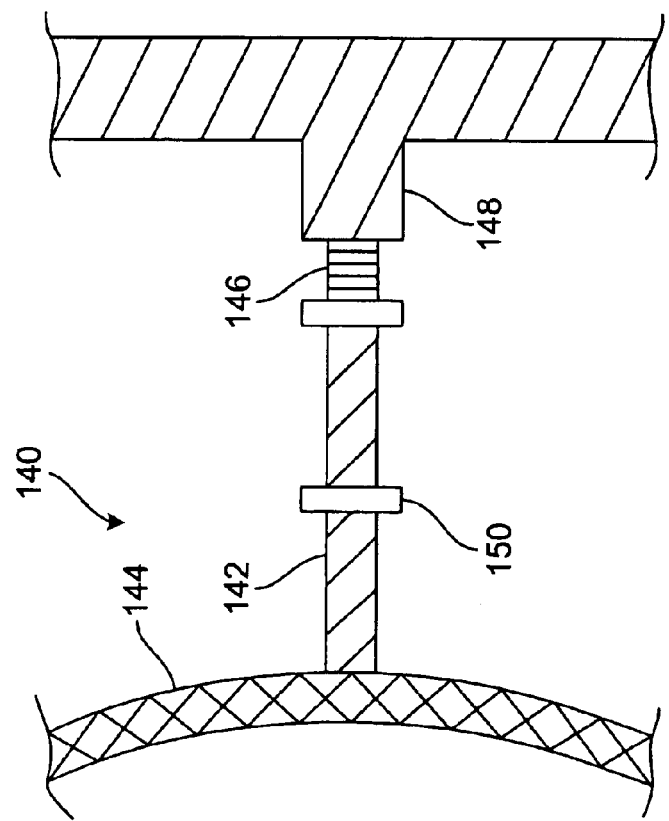
FIG. 5 shows a top view of a telescoping rod.

In the second rod embodiment, the rod is a telescoping rod that moves slidably in a substantially horizontal direction due to the compression and expansion of the rod. Additionally, in the second rod embodiment the rod is fixedly coupled to the slot valve plate and is fixedly coupled to the liner aperture plate. In this second embodiment, the rod is compressible or collapsible in the horizontal direction, but the rod is not capable of permitting the slot valve plate to move in a substantially vertical direction. This second embodiment is shown in FIG. 5 discussed further below.

In a third rod embodiment, the rod is rigid, i.e. not a telescoping rod, and is fixedly coupled to the liner aperture plate and is slidably coupled to the slot valve plate. Thus, the rod in the third embodiment is configured to permit the slot valve plate to move in a substantially vertical direction. In the third rod embodiment the rod is not a telescoping rod and, therefore, the rod is not capable of being compressed or expanded in a horizontal direction. This embodiment is described in further detail in FIG. 6A and FIG. 6B.

In the fourth rod embodiment, the rod is a telescoping rod that is slidably coupled to the slot valve plate. The rod in the fourth embodiment is configured to move in the horizontal direction by being compressed and expanded. Additionally, the rod is configured to permit the vertical movement of the slot valve plate. The actions of this rod are shown in further detail in FIG. 4A through FIG. 4E.

Referring back to FIG. 3A, there is shown an actuator 114 which is operatively coupled to the slot valve plate 108. In operation, the actuator 114 is configured to move the slot valve plate 108 which is operatively coupled to the liner aperture plate 110. During the chemical processing of the wafer, various gases enter the reactor 100 and the liner aperture plate 110 and the slot valve plate 108 are in the "closed" position. The liner aperture plate 110 occupies the liner aperture and the slot valve plate 108 sits on the valve chamber 106 and covers the valve chamber aperture. The slot valve plate 108 permits the formation of a vacuum seal for the reactor 100.

When it is time to transfer the wafer either into the reactor 100 or out of the reactor 100, the actuator 114 moves the slot valve plate 108 to provide passage to the wafer through the liner aperture, the process chamber aperture and the valve chamber aperture. Since slot valve plate 108 is rigidly coupled to the liner aperture plate by rod 112, the movement of the slot valve plate 108 results in the movement of the liner aperture plate 110. The well-known movements of the actuator 114 are performed in the well-known predetermined manner described above and hereinafter.

Referring to FIG. 4A through 4E there is shown a side view of a telescoping rod that is fixedly coupled to the liner aperture plate and slidably coupled to the slot valve plate moving from a "closed" position to an "open" position and vice versa. Recall, FIG. 4A through 4E show the fourth embodiment for coupling the slot valve plate 120 and the liner aperture plate 122 with a telescoping rod 124. It shall be appreciated by those skilled in the art that the fourth embodiment reflects the most complex operational configuration for the present invention. Thus, elements of the fourth rod embodiment will be used hereinafter to describe the remaining embodiments.

In the fourth rod embodiment, the telescoping rod 124 is slidably coupled to the slot valve plate 120. The rod 124 is configured to be compressed and expanded in the horizontal direction. More particularly, the telescoping rod 124 includes an inner retractor 126 that is fixedly coupled to the liner aperture plate 122. The telescoping rod 124 also includes an outer retractor 128 that is fixedly coupled to the slot valve plate 120. The inner retractor 126 and the outer retractor 128 are slideably coupled to one another so that the liner aperture plate 122 and the rod 124 remain in a fixed vertical position while the slot valve plate moves in a substantially vertical direction.

The actuator 130 is operatively coupled to the slot valve plate 120 and moves the slot valve plate 120 in the horizontal direction and the vertical direction. There are four well-known movements performed by the actuator 130 which include: moving the slot valve plate 128 in the x-axis so that the slot valve plate 128 sits on valve chamber 132 and covers the valve chamber aperture forming a seal; moving the slot valve plate 128 along the x-axis so that the seal with the valve chamber 132 is broken; moving the slot valve plate 128 along the y-axis so that the slot valve plate 128 is centered about the valve chamber aperture; and moving the lot valve plate 128 along the y-axis so that the slot valve plate 128 does not obstruct the passage of the wafer through the valve chamber aperture.

Figure 4B:
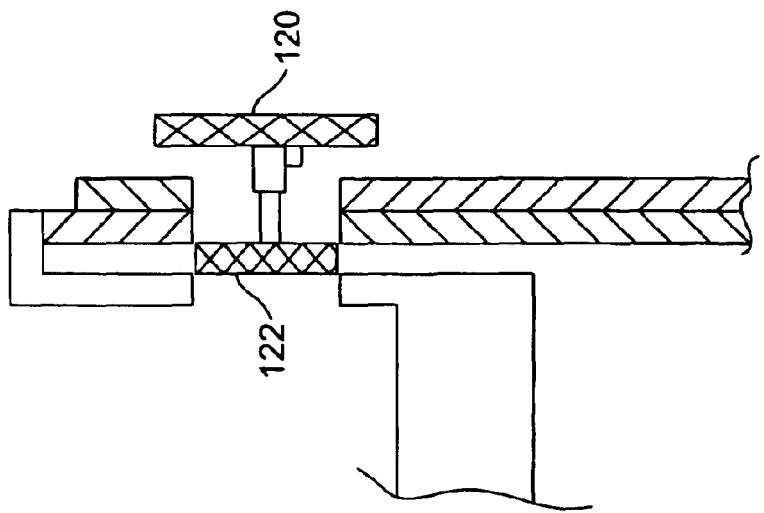
FIG. 4A through 4E shows a side view of the slot valve plate and the liner aperture plate moving from a "closed" position to an "open" position
Figure 4A:
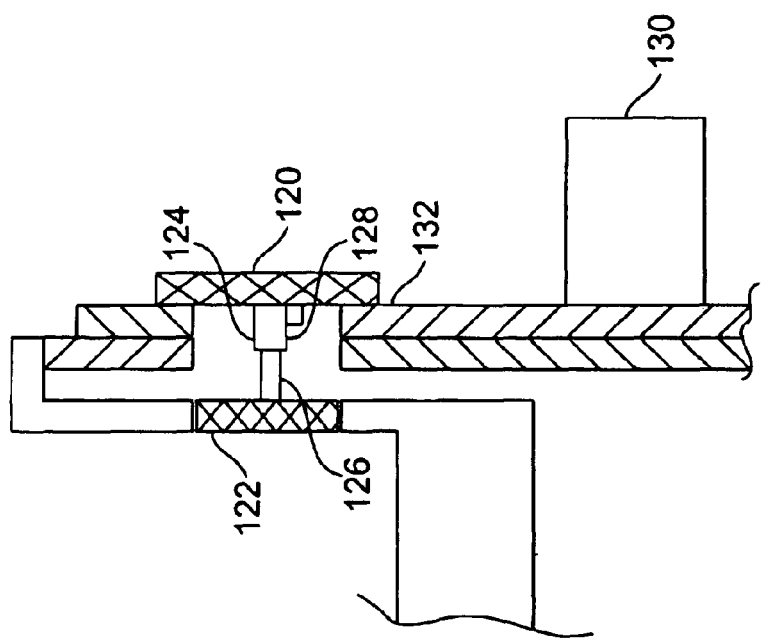
Figure 4D:
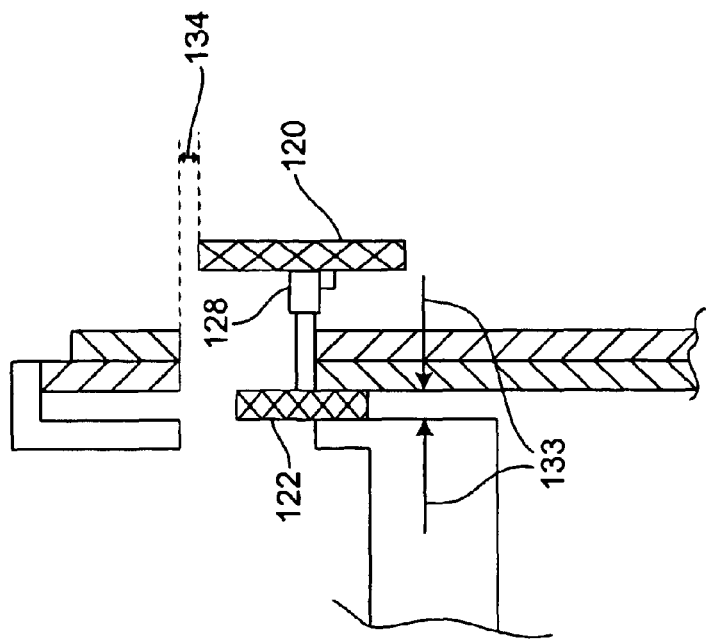
Figure 4C:
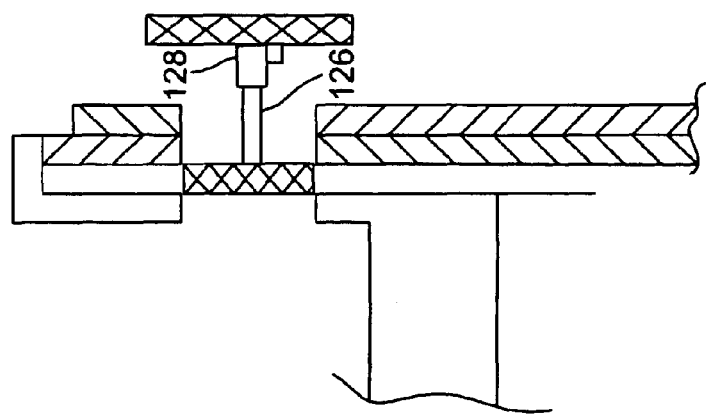

The movement in the horizontal direction for the fourth rod embodiment is shown in FIG. 4B and FIG. 4C. FIG. 4B shows the slot valve plate 120 and the liner aperture plate 122 after having moved together a controlled distance along the x-axis due to the actuator 130. In FIG. 4C the inner retractor 126 has stopped moving and the outer retractor 128 has moved an additional distance due to the actuator 130. The extra distance traveled by the outer retractor 128 results in an expansion of the telescoping rod 124.

Figure 4E:
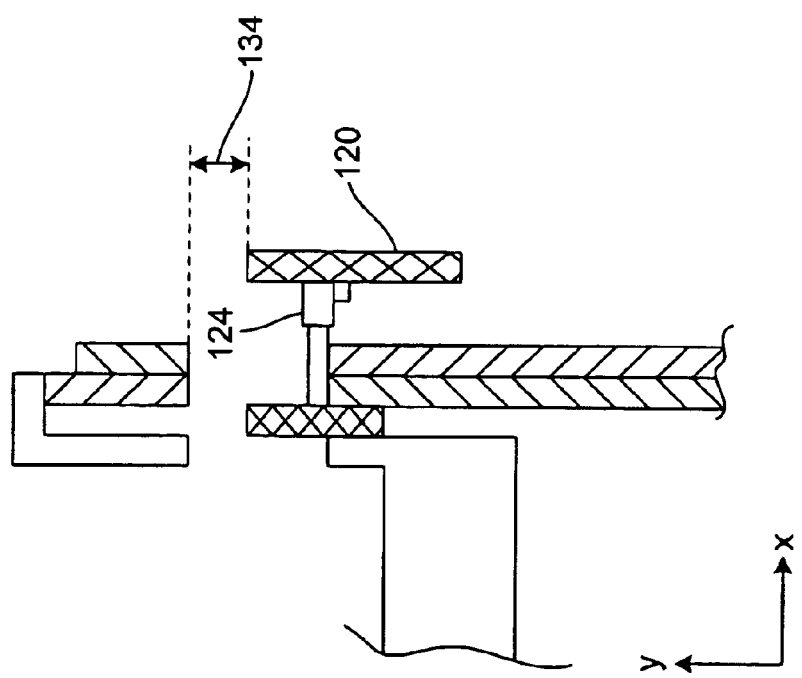

The movement in the vertical direction for the fourth rod embodiment is shown in FIG. 4D and FIG. 4E. As previously described the actuator 130 moves the slot valve plate from the centered position shown in FIG. 4C to the final "open" position shown in FIG. 4E.

In FIG. 4D the slot valve plate 120 and the liner aperture plate 122 have moved together a controlled distance in the y-direction from the position shown in FIG. 4C. In FIG. 4D, the liner aperture plate 122 is a portion of gap 133. However, the combined movement of the slot valve plate 120 and the liner aperture plate 122 in the y-direction is not sufficient to provide an adequate gap 134 for the passage of a wafer. Therefore, the gap 134 needs to be increased. As previously mentioned the rod 124 is slidably coupled to the slot valve plate 120. More particularly, the outer retractor 128 is slidably coupled to the slot valve plate 120.

Referring to FIG. 4E there is shown the slot valve plate 120 after it has moved along the y-axis while the rod 124 and the liner aperture plate 122 remain in the same position. As a result of the slot valve plate 120 moving in the y-axis, the gap 134 is increased to provide an adequate gap for the passage of the wafer. An existing slot valve plate 120 can be modified to include an additional slot (not shown) along the y-axis that permits the rod 124 to be slidably coupled to the slot valve plate 120. FIG. 4E shows the slot valve plate 120 and the liner aperture plate 122 in an "open" position.

To move the slot valve plate 120 and the liner aperture plate from the "open" position to the "closed" position, the actuator moves the slot valve plate 120 along the y-axis from the FIG. 4E position to the FIG. 4C position via the FIG. 4D position. After the slot valve plate 128 is centered about the valve chamber aperture, the actuator then moves the slot valve to the closed position as shown in FIG. 4A via the FIG. 4B position. The telescoping rod 128 is compressed from the FIG. 4C to the FIG. 4B position.

Referring to FIG. 5 there is shown a top view of a telescoping rod embodiment, i.e. the second rod embodiment, that moves slidably in a substantially horizontal direction due to the compression and expansion of the rod 140 as shown in FIG. 4A through 4C. The telescoping rod 140 comprises an inner retractor 142 which is fixedly coupled to the liner aperture plate 144, and an outer retractor 146 that is fixedly coupled to the slot valve plate 148. The telescoping rod 140 is compressible or collapsible in the horizontal direction, but the rod is not capable of permitting vertical motion of the slot valve plate while the rod 140 remains in a fixed location. Thus the telescoping rod 140 moves in the vertical direction in a manner similar to FIG. 4C and 4C. The telescoping rod 140 permits the liner valve plate 144 to move a shorter distance than the slot valve plate 148. As an illustrative example, the positioner 150 provides a stop for the compression of the telescoping rod 140. It shall be appreciated by those skilled in the art having the benefit of this disclosure that another positioner or other such device may be used to regulate the expansion and compression of the telescoping rod 140

Thus the telescoping rod 140 acts as a "stroke absorber" for the liner aperture plate 144. Effectively, the telescoping rod 140 absorbs the additional distance moved in the x-axis due to the actuator (not shown) being operatively coupled to the slot valve plate 148. Thus, the liner aperture plate 144 may be moved a distance "x" to fit into the gap between the liner and the process chamber, and the slot plate valve 148 may be moved a distance "y", such that "y" is greater than or equal to "x". Typically, the "x" distance is less than 0.125 inches and the "y" distance is greater than 0.125 inches.

Figure 6B:
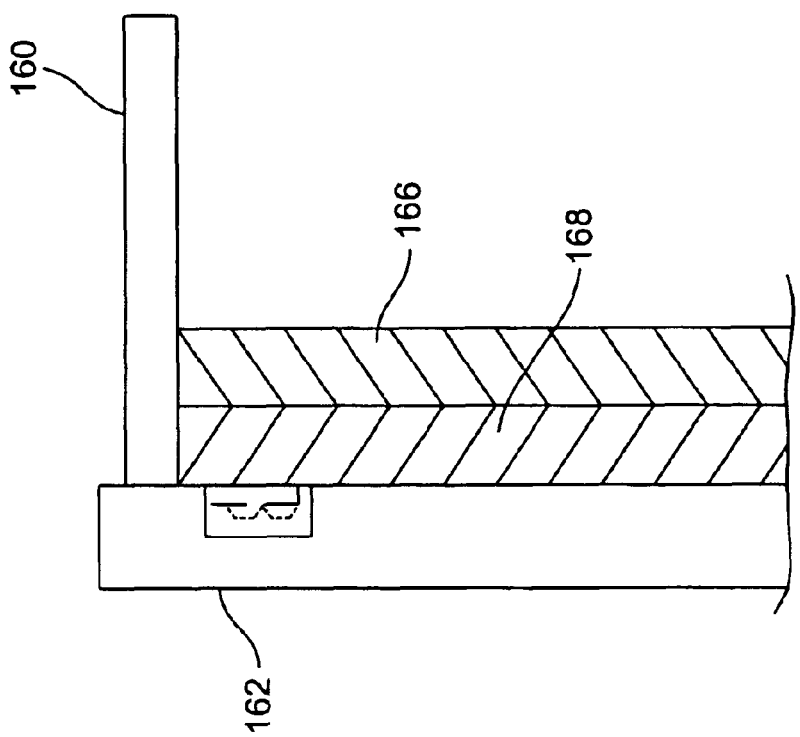
FIG. 6A and FIG. 6B show a side view of a rod slidably coupled to a slot valve plate.
Figure 6A:
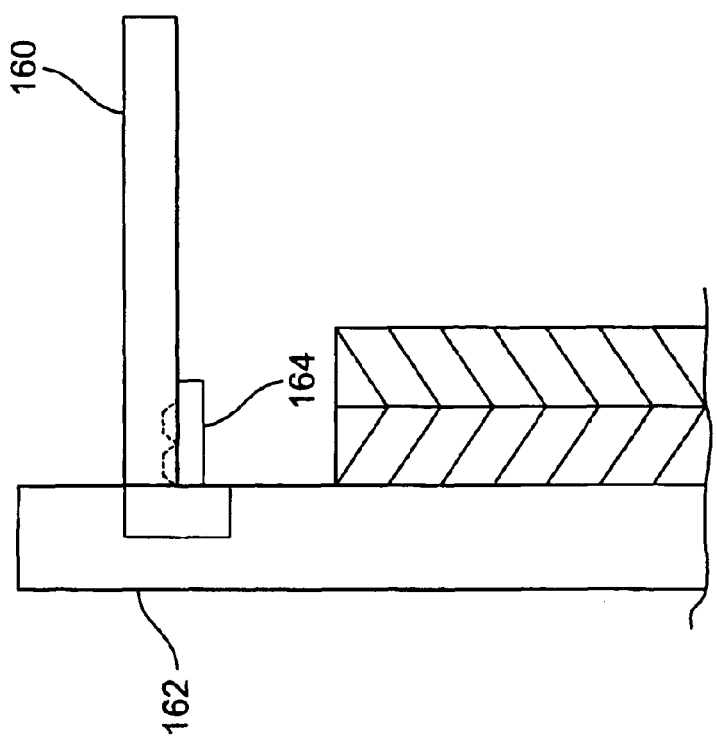

Referring to FIGS. 6A and 6B there is shown another embodiment, i.e. the third embodiment, in which a rod 160 is slidably coupled to a slot valve plate 162. As shown in FIG. 4D and FIG. 4E, this third embodiment allows the slot valve plate 162 to move in the vertical direction while the rod 160 stays in the same position. FIG. 6A and 6B shows a rigid rod 160 that does not expand or compress in the horizontal direction, and moves to the horizontal positions described in FIG. 4A and FIG. 4B.

The rod 160 permits the slot valve plate 162 to move in a substantially vertical direction by employing a retractor 164. In FIG. 6A, the retractor is in a "down" position and the rod 160 is supported by the retractor 164. The retractor 164 remains in this down position during the horizontal movement of the slot valve plate 160 and during a portion of the vertical movement.

In FIG. 6B, the retractor has moved to the "up" position so that the rod 160 remains in a fixed position and the slot valve plate 162 follows the predetermined actuator movements to the "open" position. In operation, the rod 160 hits the edge of the process chamber 168 and/or valve chamber 166 and the retractor 164 no longer provides support for the rod 160. The support for the rod 160 is transferred to the edge of the process chamber 168 and/or the valve chamber 166. It shall be appreciated by those skilled in the art that a variety of different well known devices may be adapted to perform the function of the retractor.

The invention described above provides a liner aperture plate that fills the liner aperture and generates a uniform symmetrical reactor. The uniform symmetrical reactor provides uniform gas distribution, uniform gas density and uniform plasma density. Additionally, the solution provided by this invention does not require adding additional actuators, adding bellows, making substantial modifications to the existing reactor design, or adding new control circuitry or software. Thus, the invention results in a symmetrical reactor and which does not require significant modifications to existing reactor designs.

It shall be appreciated by those skilled in the art that the illustrative embodiments provided above may change depending on the type of reactor, the substrate size, the feature size, and other such variables that are well known to those skilled in the art. It shall also be appreciated by those skilled in the art, that a rock valve may also be used with the present invention. Thus the illustrative embodiments provided should not be construed as limiting the scope of the invention but as merely providing illustrations of some of the presently preferred embodiments of this invention. Therefore, the scope of the invention should be determined by the appended claims and their legal equivalents rather than by the illustrative examples given.

What is claimed is:

1. A reactor for semiconductor processing, comprising:
   a liner having a liner aperture adapted to provide passage for a wafer;
   a chamber coupled to said liner, said chamber having a chamber aperture adapted to provide passage for said wafer;
   a slot valve plate configured to cover said chamber aperture;
   a liner aperture plate configured to occupy said liner aperture;
   a rod that is coupled to said liner aperture plate and said slot valve plate; and
   an actuator coupled to said slot valve plate, said actuator configured to move said slot valve plate.

2. The reactor of claim 1 wherein said actuator is configured to move said slot valve plate and said liner aperture plate in an essentially horizontal position and in an essentially vertical position.

3. The reactor of claim 1 configured to process said wafer by having said liner aperture plate occupy said liner aperture and having said slot valve plate covering said chamber aperture to form a vacuum seal.

4. The reactor of claim 1 wherein said actuator is configured move said slot valve plate and said liner aperture plate to provide passage to said wafer through said liner aperture and said chamber aperture.

5. The reactor of claim 1 wherein said liner includes a cylindrical portion having a liner aperture that is curved.

6. The reactor of claim 1 wherein said chamber portion proximal said chamber aperture has a planar face adapted to receive said slot valve plate, said slot valve plate being planar.

7. The reactor of claim 1 wherein said actuator is configured to move said slot valve plate from a closed position to an open position by first moving said slot valve plate in an essentially horizontal direction and then moving said slot valve plate in an essentially vertical direction.

8. The reactor of claim 1 wherein said rod is a telescoping rod, comprising:
- an inner retractor fixedly coupled to said liner aperture plate; and
- an outer retractor fixedly coupled to said slot valve plate, said inner retractor and said outer retractor being slideably coupled to one another.

9. The reactor of claim 1 wherein said rod is slidably coupled to said slot valve plate.

10. The reactor of claim 9 wherein said rod is configured to permit said slot valve plate to move a first distance vertically and configured to permit said liner aperture plate to move a second distance vertically.

11. A reactor for semiconductor processing, comprising:
- a liner having a liner aperture adapted to provide passage for a wafer;
- a chamber coupled to said liner, said chamber having a chamber aperture adapted to provide passage for said wafer;
- a slot valve plate configured to cover said chamber aperture;
- a liner aperture plate configured to occupy said liner aperture;
- a telescoping rod, including,
  - an inner retractor fixedly coupled to said liner aperture plate; and
  - an outer retractor fixedly coupled to said slot valve plate, said inner retractor
- and said outer retractor being slideably coupled to one another; and
- an actuator coupled to said slot valve plate, said actuator configured to move said slot valve plate.

12. The reactor of claim 11 wherein said actuator is configured to move said slot valve plate and said liner aperture plate in an essentially horizontal position and in an essentially vertical position.

13. The reactor of claim 11 configured to process said wafer by having said liner aperture plate occupy said liner aperture and having said slot valve plate covering said chamber aperture to form a vacuum seal.

14. The reactor of claim 11 wherein said actuator is configured move said slot valve plate and said liner aperture plate to provide passage to said wafer through said liner aperture and said chamber aperture.

15. The reactor of claim 11 wherein said liner includes a cylindrical portion having a liner aperture that is curved.

16. The reactor of claim 11 wherein said chamber portion proximal said chamber aperture has a planar face adapted to receive said slot valve plate, said slot valve plate being planar.

17. The reactor of claim 11 wherein said actuator is configured to move said slot valve plate from a closed position to an open position by first moving said slot valve plate in an essentially horizontal direction and then moving said slot valve plate in an essentially vertical direction.

18. The reactor of claim 11 wherein said reactor of said telescoping rod is slidably coupled to said slot valve plate.

19. The reactor of claim 18 wherein said rod is configured to permit said slot valve plate to move a first distance vertically and configured to permit said liner aperture plate to move a second distance vertically.

20. A reactor for semiconductor processing, comprising:
- a liner having a liner aperture adapted to provide passage for a wafer;
- a chamber coupled to said liner, said chamber having a chamber aperture adapted to provide passage for said wafer;
- a slot valve plate configured to cover said chamber aperture;
- a liner aperture plate configured to occupy said liner aperture;
- a telescoping rod, including,
  - an inner retractor fixedly coupled to said liner aperture plate; and
  - an outer retractor fixedly coupled to said slot valve plate, said inner retractor
- and said outer retractor being slideably coupled to one another; and
- an actuator coupled to said slot valve plate, said actuator configured to move said slot valve plate in an essentially horizontal position and in an essentially vertical position.

21. The reactor of claim 20 configured to process said wafer by having said liner aperture plate occupy said liner aperture and having said slot valve plate covering said chamber aperture to form a vacuum seal.

22. The reactor of claim 20 wherein said actuator is configured move said slot valve plate and said liner aperture plate to provide passage to said wafer through said liner aperture and said chamber aperture.

23. The reactor of claim 20 wherein said liner includes a cylindrical portion having a liner aperture that is curved.

24. The reactor of claim 20 wherein said chamber portion proximal said chamber aperture has a planar face adapted to receive said slot valve plate, said slot valve plate being planar.

25. The reactor of claim 20 wherein said actuator is configured to move said slot valve plate from a closed position to an open position by first moving said slot valve plate in an essentially horizontal direction and then moving said slot valve plate in an essentially vertical direction.

26. The reactor of claim 20 wherein said rod is slidably coupled to said slot valve plate.

27. The reactor of claim 26 wherein said rod is configured to permit said slot valve plate to move a first distance vertically and configured to permit said liner aperture plate to move a second distance vertically.

* * * * *